(12) United States Patent
Ba-Tis et al.

(10) Patent No.: US 11,708,263 B2
(45) Date of Patent: Jul. 25, 2023

(54) THERMAL COMPENSATION OF LENS ASSEMBLY FOCUS USING IMAGE SENSOR SHIFT

(71) Applicant: Sheba Microsystems Inc., Toronto (CA)

(72) Inventors: Faez Ba-Tis, Toronto (CA); Ahmed Galaom, Toronto (CA); Ridha Ben-Mrad, Toronto (CA)

( * ) Notice: Subject to any disclaimer, the term of this patent is extended or adjusted under 35 U.S.C. 154(b) by 210 days.

(21) Appl. No.: 17/313,565

(22) Filed: May 6, 2021

(65) Prior Publication Data

US 2021/0354979 A1 Nov. 18, 2021

Related U.S. Application Data

(60) Provisional application No. 63/023,941, filed on May 13, 2020.

(51) Int. Cl.
| | |
|---|---|
| *B81B 3/00* | (2006.01) |
| *B81C 1/00* | (2006.01) |
| *G02B 5/20* | (2006.01) |
| *G02B 7/02* | (2021.01) |
| *H02N 1/00* | (2006.01) |
| *H04N 23/52* | (2023.01) |
| *H04N 23/54* | (2023.01) |

(52) U.S. Cl.
CPC .......... *B81B 3/0081* (2013.01); *B81C 1/0069* (2013.01); *G02B 5/208* (2013.01); *G02B 7/02* (2013.01); *H02N 1/006* (2013.01); *H04N 23/52* (2023.01); *H04N 23/54* (2023.01); *B81B 2201/03* (2013.01); *B81B 2203/0163* (2013.01); *B81B 2207/07* (2013.01)

(58) Field of Classification Search
CPC .............. H04N 5/22521; H04N 5/2253; B81B 2207/07; B81B 3/0081; H02N 1/006; G02B 5/208; G02B 7/02; G02B 7/105; G02B 7/08; G02B 26/0841
USPC ............................. 359/557; 310/309; 335/78
See application file for complete search history.

(56) References Cited

U.S. PATENT DOCUMENTS

| | | | |
|---|---|---|---|
| 10,582,100 B1 * | 3/2020 | Ba-Tis et al. ........ | G01D 5/2412 |
| 2011/0080479 A1 * | 4/2011 | Trumbo et al. ........ | H04N 23/00 348/143 |
| 2013/0057745 A1 * | 3/2013 | Yoshida ................. | H04N 23/00 348/333.01 |
| 2018/0059381 A1 * | 3/2018 | Sharma et al. ........ | H04N 23/00 |
| 2018/0323167 A1 * | 11/2018 | Kuong .................... | H01L 24/78 |
| 2019/0219892 A1 * | 7/2019 | Park ....................... | H04N 23/00 |

* cited by examiner

*Primary Examiner* — Xi Wang
(74) *Attorney, Agent, or Firm* — Nasser Ashgriz; UIPatent Inc.

(57) ABSTRACT

A camera system incorporating a MEMS actuator to achieve focus adjustments to compensate for the thermal expansion of the lens assembly is disclosed. The camera comprises a lens barrel, lens holder, infra-red (IR) filter, board circuit, MEMS actuator, housing package for the actuator, and an image sensor. The image sensor is directly wire bonded to pads on the circuit board such that these pads are movable at the image sensor end and fixed at the circuit board end. When the camera is exposed to temperature variations, the MEMS actuator moves the sensor along the optical axis to maintain the image in focus.

13 Claims, 8 Drawing Sheets

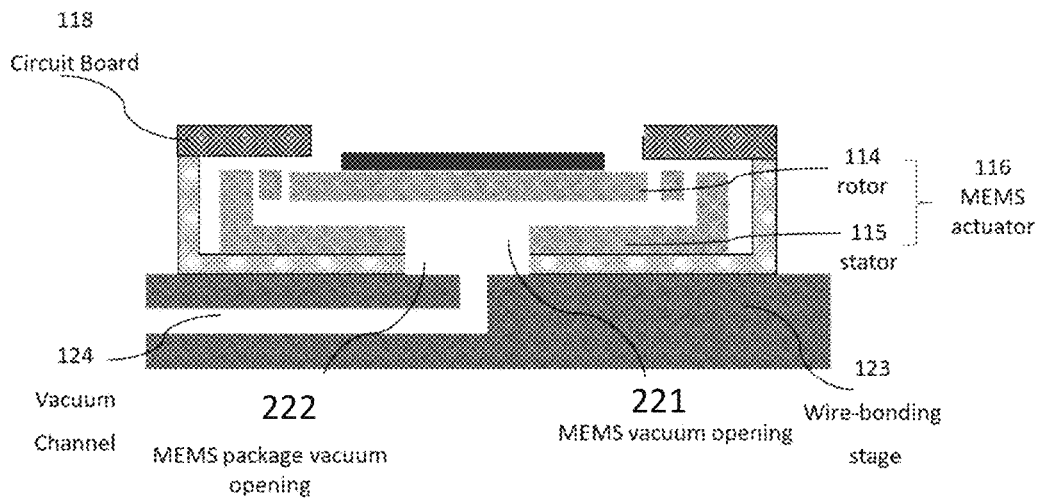
FIG. 3A  Vaccum OFF
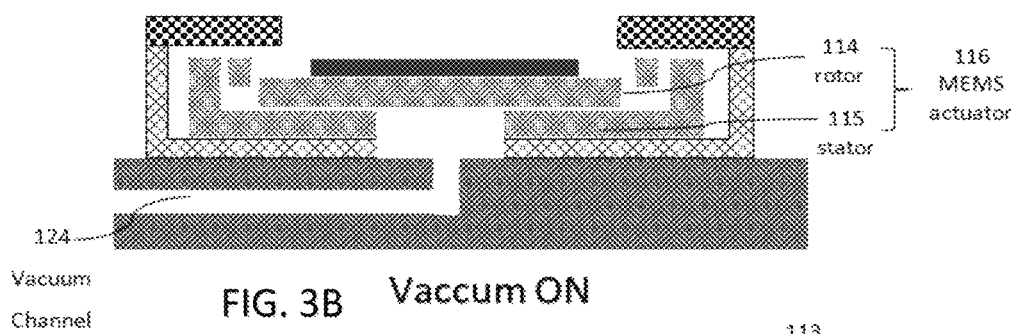
FIG. 3B  Vaccum ON
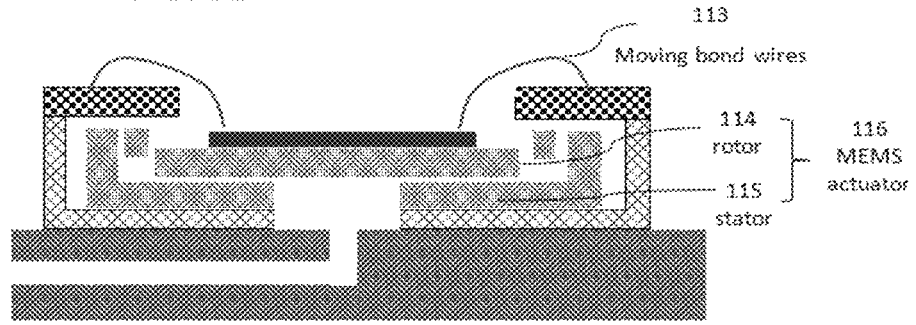
FIG. 3C  Vaccum ON
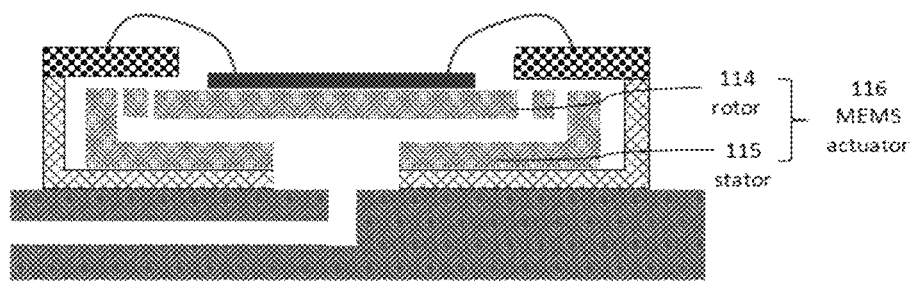
FIG. 3D  Vaccum OFF

THERMAL COMPENSATION OF LENS ASSEMBLY FOCUS USING IMAGE SENSOR SHIFT

FIELD OF THE INVENTION

The invention relates to the field of optical alignment systems of lens assembly in cameras. More specifically it relates to thermal compensation mechanism of the lens assembly focus when the lens profile changes due to temperature variations. Such compensation is especially needed for cameras with large optical assemblies including those used in automotive, action, defense, drones, security, mobile robotics, virtual reality, augmented reality, smartphones, laptops and many others.

BACKGROUND OF THE INVENTION

It has been known that the temperature variations change the optical lenses profile (e.g. expansion and/or contraction) within cameras and results in changes of the focal length of the optical system. Such change in the focal length leads to shifting of the image away from the sensor plane such that the image becomes out of focus, thus blurred. As the camera optics become larger, such a problem becomes much pronounced.

Using traditional actuation methods to solve this problem is very challenging as the motion required is limited (e.g. less than 100 μm in some cases) and a submicron precision of the actuator is needed, and the camera assembly including the actuator is immune against rapid accelerations during use. Moving the optics (lens barrel) of these cameras using electromagnetic actuators or voice coil motors (VCM) to solve the thermal drift issue is not a feasible solution. That is because the VCM is known to have a precision in the range of few microns (i.e. ~5 μm) due to hysteresis and other effects and VCMs are also sensitive to acceleration force given that the optics load of such camera systems can be up to few thousands of milligrams.

Other techniques, presented in (U.S. Pat. No. 9,594, 228B1, US20170195545A1), use either different materials for the optical elements that have different thermal expansion to compensate for the thermal drift or use a software compensation method. Such techniques are complex to use and lead to expensive lens design of the cameras or are inefficient and offer limited enhancements as is the case when using software tools for compensation.

Moving the image sensor along the optical axis is the most efficient approach to overcome such an issue; knowing that the image sensor weight is a fraction of the lens weight (as an example, the weight of the image sensor for an automotive camera is in the range of 25 mg as opposed to the weight of the lens barrel being 3000 mg).

SUMMARY OF THE INVENTION

The present invention discloses a novel mechanism to compensate for thermal drift in cameras by moving the image sensor along the optical axis. A camera system that incorporates such technique consists of a lens barrel, a lens barrel holder, an IR filter, an image sensor, a MEMS actuator, and a circuit board.

In one embodiment of the present invention, the camera system consists of a lens barrel that is firmly attached to the lens holder through a thread or glue forming the lens assembly. The IR filter could be attached to the lens assembly or it could be supported by an IR holder that is attached to the top surface of the circuit board. The lens assembly and the IR filter form the front part of the camera.

The image sensor is rigidly attached to the rotor (moving part) of the MEMS actuator and the MEMS actuator is attached to the top surface of the circuit board. The image sensor is wire bonded directly to the circuit board such that the wires can be slack and floating, but are relatively stiff to avoid touching between the wires. The Image sensor, the MEMS actuator, and the circuit board form the back part of the camera.

In another embodiment of the present invention, the back part of the camera may consist of the MEMS housing where the MEMS actuator is placed inside the housing, and an image sensor attached to the rotor of the MEMS actuator. The MEMS actuator is then attached to the backside of the circuit board via glue or adhesive.

The circuit board may have a cut out such that it allows the light to reach to the image sensor. The front part of the camera, in this embodiment, is attached to the circuit board from the top side using glue or an adhesive.

The MEMS actuator disclosed in (U.S. Pat. No. 9,306, 475B1), which is incorporated here in its entirety, is the preferred actuator to move the image sensor precisely with submicron precision and large stroke, enough to achieve compensation for thermal drift in cameras.

BRIEF DESCRIPTION OF DRAWINGS

Embodiments herein will hereinafter be described in conjunction with the drawings provided to illustrate and not to limit the scope of the claims, wherein like designations denote like elements, and in which:

FIG. 3A illustrates cross sectional view of the MEMS housing package placement on the wire bonding stage before the application of the vacuum onto the stage.

FIG. 3B illustrates cross sectional view of the MEMS housing package placement on the wire bonding stage when the vacuum is applied.

FIG. 3C illustrates cross sectional view of the MEMS housing package with MEMS, image sensor and circuit board placed on the wire-bonding stage with the vacuum on during the wire bonding process.

FIG. 3D illustrates cross sectional view of the MEMS housing package with MEMS, image sensor and circuit board placed on the wire-bonding stage with the vacuum off once the wire bonding process is complete and the MEMS rotor returns to its equilibrium position.

DETAILED DESCRIPTION OF THE INVENTION

Figure 1A:
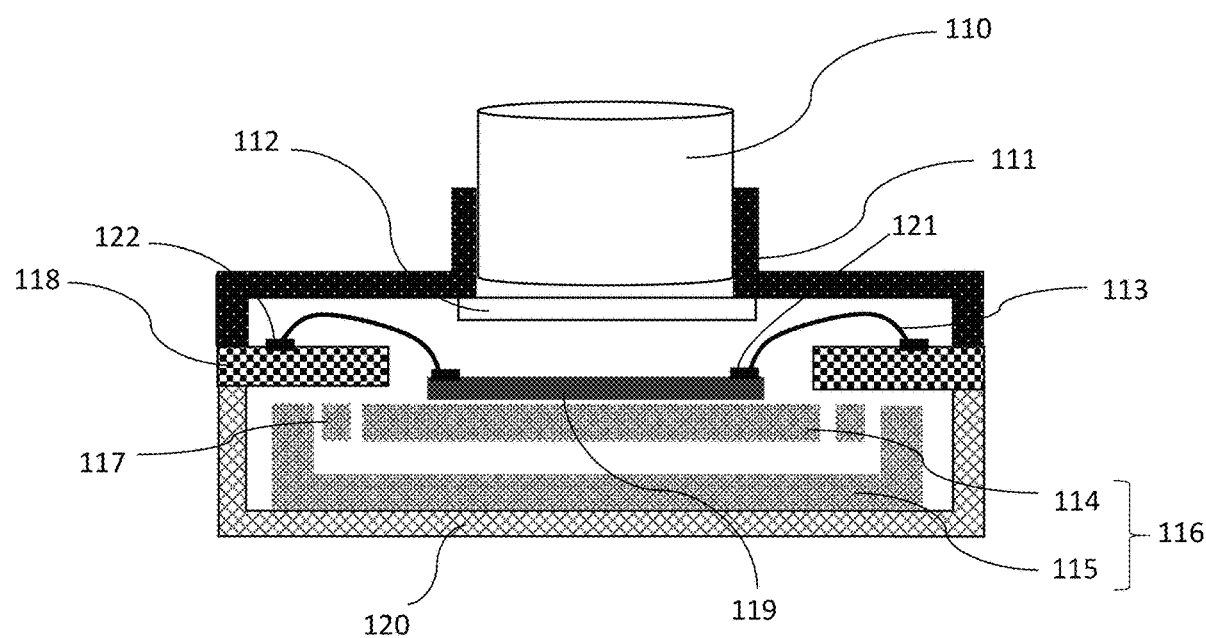
FIG. 1A illustrates a cross sectional view of a camera system with thermal drift compensation by incorporating a MEMS actuator where the MEMS is located under the circuit board.
Figure 1B:
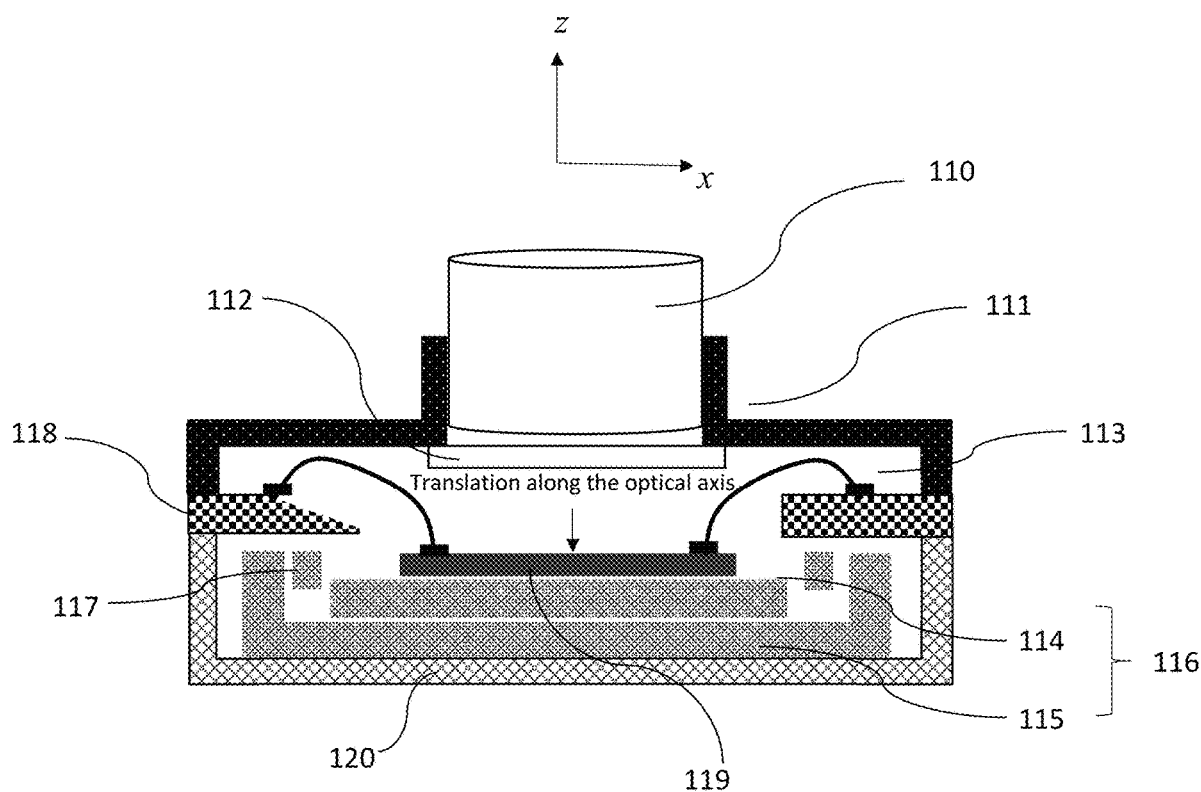
FIG. 1B illustrates a cross sectional view of the camera system in FIG. 1A while the MEMS actuator is in translation motion along the optical axis (z) to compensate for thermal drift.
Figure 1C:
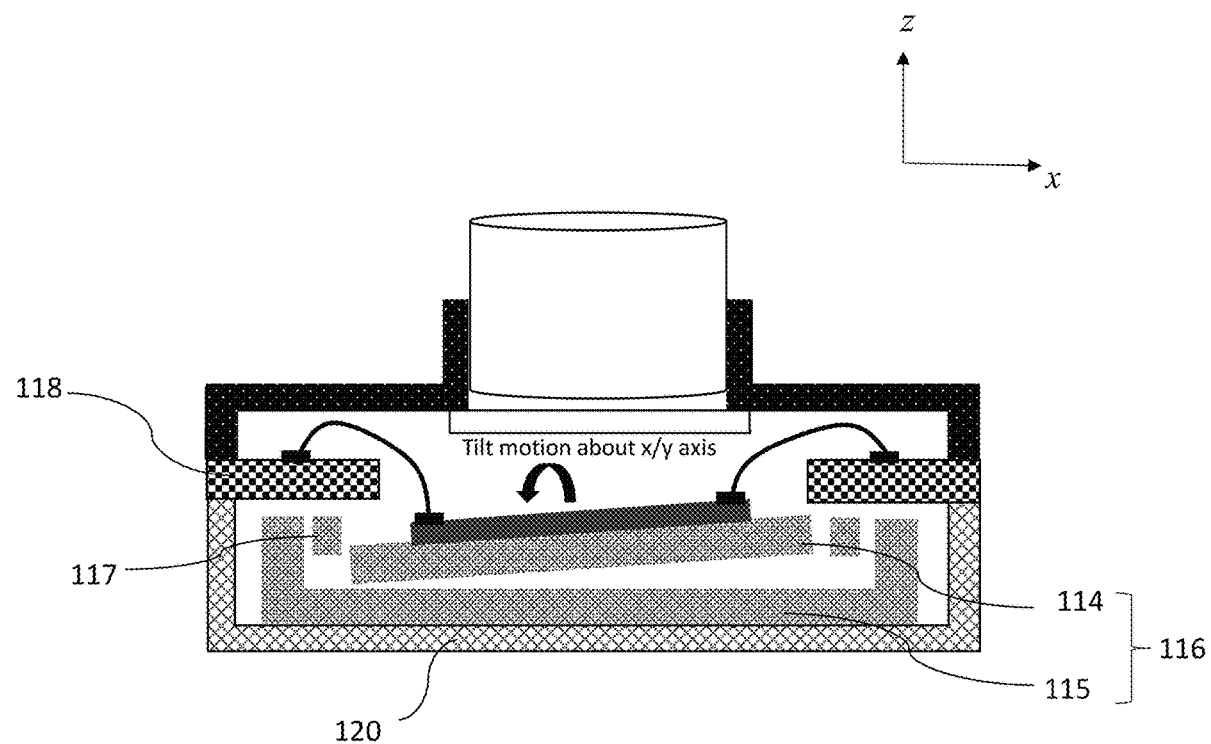
FIG. 1C illustrates cross sectional view of the camera system in FIG. 1A while the MEMS actuator is in tilt motion about one or both of the in-plane axes (x/y) to compensate for the thermal drift.

The present invention of the camera system with a thermal drift compensation mechanism is illustrated in FIG. 1A-1C. The camera incorporates a MEMS actuator that performs the focus adjustments of the camera to keep the image always in focus when temperature varies.

The camera consists of two parts. The front part includes a lens assembly (lens barrel) 110, lens holder 111, and an IR filter 112. The lens barrel is attached to the lens holder while the IR filter is attached to the backside of the lens holder. In another embodiment, the IR filter might be attached directly to the circuit board while supported by an IR holder.

The back part of the camera consists of a MEMS actuator 116, image sensor 119, a housing package for the MEMS actuator 120, a moving or slack bond wires 113, and a circuit board 118. The MEMS actuator consists of a stator (fixed part) 115, a rotor (moving part) 114, and mechanical springs 117. The image sensor is attached to the rotor of the MEMS actuator using die bond technique via a glue or an adhesive. The MEMS actuator with the image sensor are housed within a package, which is attached to the back side of the circuit board using a glue or an adhesive. The image sensor is wire bonded directly from the sensor pads 121 to the circuit board pads 122 using a wire bonder such that the bond wires 113 are movable from one end (image sensor side) and fixed from the other end of the circuit board. The front part of the camera is optically aligned and mechanically attached the top side of the circuit board.

In the preferred embodiment, the MEMS actuator as disclosed in U.S. Pat. No. 9,306,475B1 is used, the details of which are incorporated here in its entirety. The MEMS actuator moves the image sensor along the optical axis to do focus adjustments in order to compensate for the thermal effects on the focus of the lens assembly (FIG. 1B). The actuator may also tilt the sensor around the x and y axes to perform optical alignment to correct for static and moving tilts during sensor motion (FIG. 1C). The length and stiffness of the bond wires are configured such that during the movement of the rotor, both axially and rotationally, the wires do not touch each other.

Figure 2A:
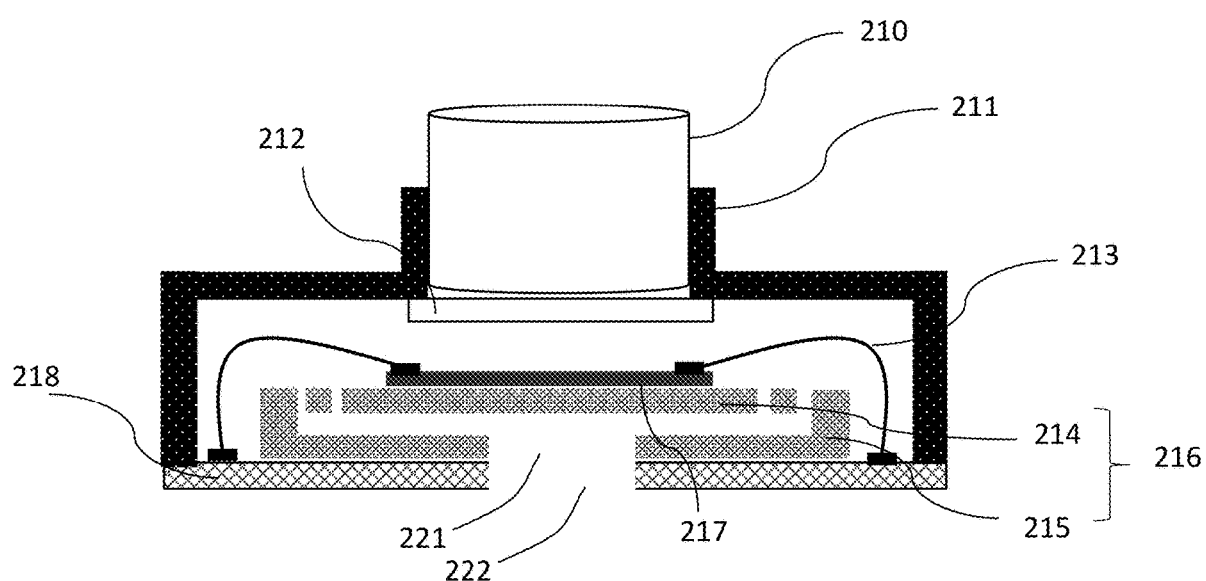
FIG. 2A illustrates a cross sectional view of another embodiment of a camera system with thermal drift compensation by incorporating a MEMS actuator where the MEMS is located above the circuit board.
Figure 2B:
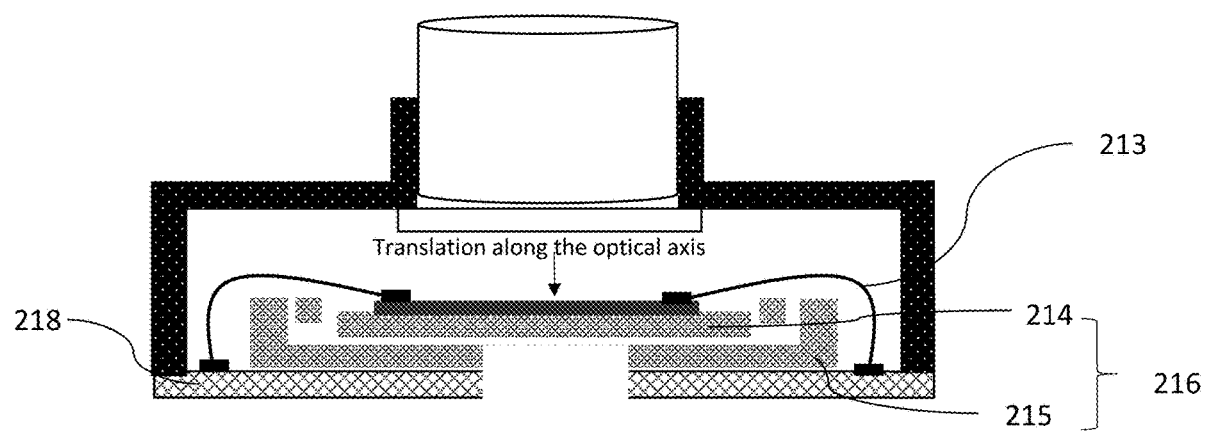
FIG. 2B illustrates a cross sectional view of the camera system in FIG. 2A while the MEMS actuator is in translation motion along the optical axis (z) to compensate for the thermal drift.

Another embodiment of the present invention is illustrated in FIG. 2A-B. The camera consists of two parts. The front part comprises a lens assembly (lens barrel) 210, lens holder 211, and an IR filter 212. The lens barrel is attached to the front side of the lens holder while the IR filter is attached to the backside. The back part of the camera comprises an image sensor 217 that is attached to the rotor 214 of the MEMS actuator 216 and the stator 215 of the MEMS actuator is attached to the top side of the circuit board 218. The image sensor is wire bonded to the circuit board pads that are located at the outside perimeter of the actuator. In this embodiment, there is an opening 221, 222 both in the actuator and in the housing to connect the system to a vacuum in order to do wire bonding.

A number of steps have to be taken into consideration when performing a direct wire bonding process on an image sensor that sits on top of a floating MEMS structure. These include that the wires are subject to minimal stresses during motion of the image sensor so the bonds on the image sensor hold and the wires have to return back to their initial position unobstructed after the image sensor motion is completed. During the wire bonding process on a MEMS floating structure, the MEMS rotor has to be held firm during the bonding. Other parameters of the bonding process including the wire loop height, shape and bond forces which are all critical to a successful wire bonding process.

The present invention discloses a method of performing a wire bonding process on a floating (moving) image sensor as the sensor sits on the MEMS moving part. While the wire bonding process is normally performed on two mechanically fixed pads (the image sensor pad and the circuit board pad), performing the wire bonding on a floating pad presents a number of challenges.

The flow chart of the present novel method of wire-bonding on moving pads is illustrated in FIG. 3. The MEMS actuator incorporates an opening from the back side (stator side) and it is referred to as the MEMS vacuum opening 221. The purpose of such opening is to allow the vacuum to pull the MEMS rotor down and mechanically make it stationary during wire bonding so that the image sensor pads do not move due to the bonding force. The MEMS housing package 120, in turn, incorporates a vacuum opening 222 to allow the vacuum to be applied to the MEMS actuator. Both of the MEMS housing package and the MEMS actuator with the image sensor attached to it are placed on a wire bonding stage 123 that is equipped with a vacuum channel 124. The MEMS housing package is attached to the vacuum wire bonding stage by means of mounting, which could be clamps, or other vacuum channel in the stage.

FIG. 3A shows the MEMS housing package placement on the wire bonding stage before the application of the vacuum onto the stage. The rotor 114 of the MEMS is floating (moveable). When the vacuum is applied to the wire bonding stage, the MEMS rotor holding the image sensor is pulled down towards the fixed stator, refer to FIG. 3B. As a result, the rotor becomes mechanically fixed, thus the image sensor pads are also fixed, which enables a successful wire bonding process. The wires are bonded directly from the image sensor to the circuit board while the MEMS rotor is fixed as illustrated in FIG. 3C. Finally, the vacuum is switched off, and the MEMS rotor moves back to its rest position, refer to FIG. 3D.

This method of wire bonding on a moving MEMS structure is unique as it allows to fix the structure and perform wire bonding on it by using a non-destructive mechanism of fixation, so the fragile structure remains intact.

Figure 4:
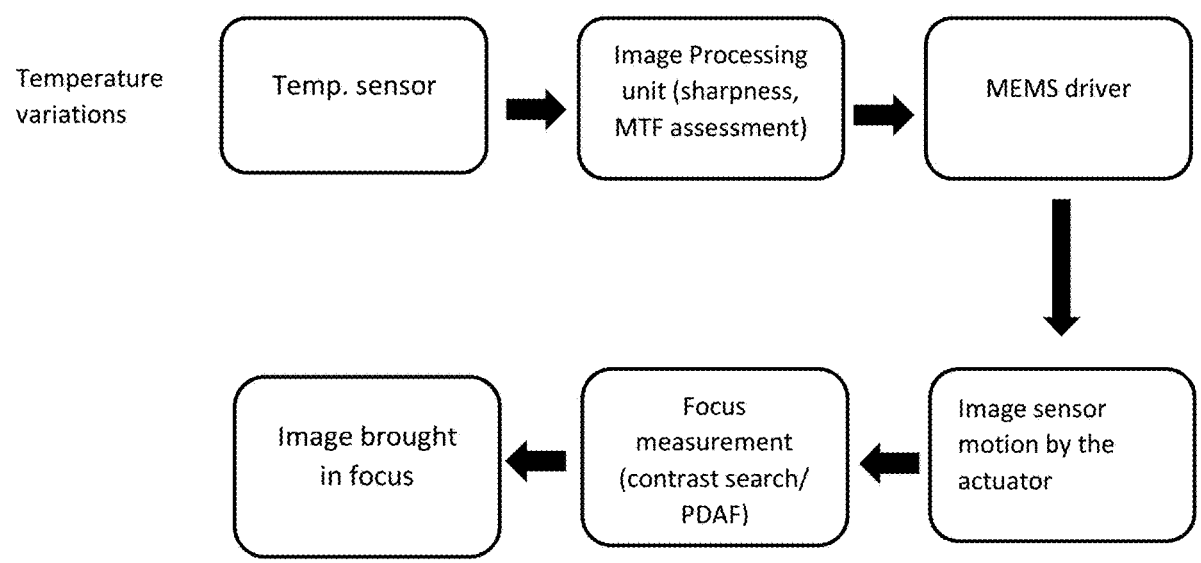
FIG. 4 shows a block diagram of the control system for cameras with thermal compensation feature using image sensor shift technology.
Figure 5:
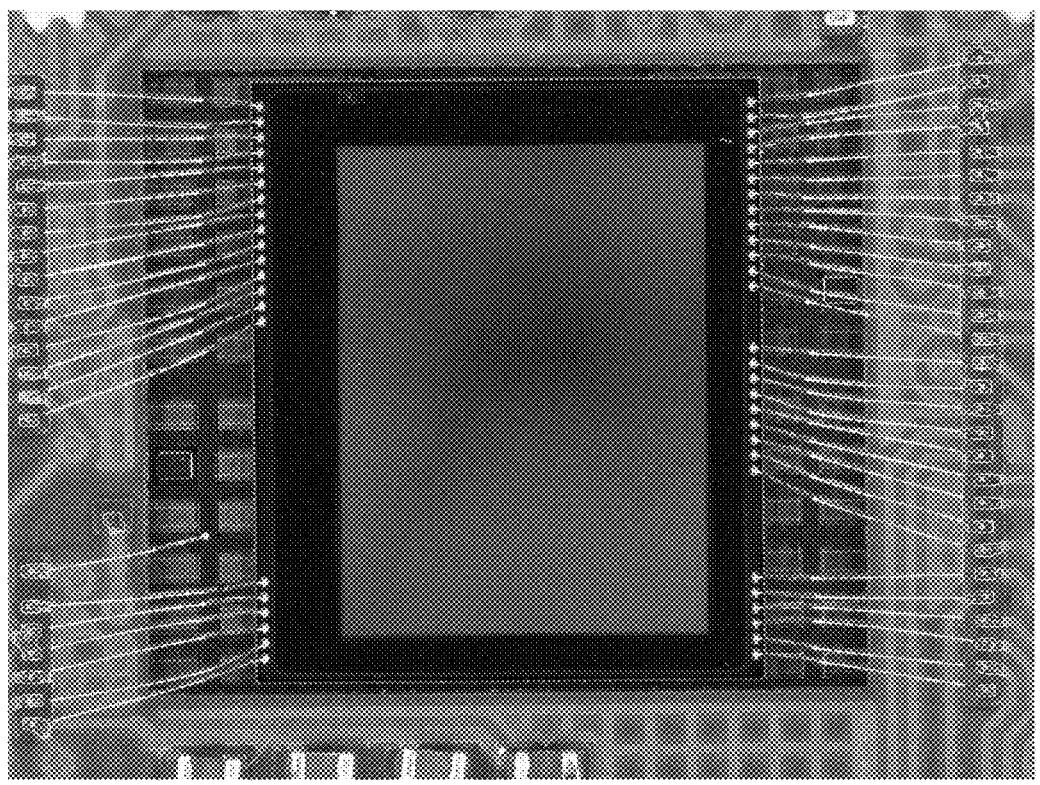
FIG. 5 shows a wire bonded moving image sensor.

The operational concept and the control system are explained in FIG. 4, and a wire bonded image sensor is shown in FIG. 5. A temperature sensor is embedded in the system to continuously measure the temperature changes. When temperature changes are detected, the image processing unit performs sharpness measurements or modulation transfer function (MTF) assessment of the current image that the camera is streaming. If the focus/sharpness value or the MTF value of the image has changed from the previous default value, the MEMS driver instructs the actuator to do focus adjustment by moving the image sensor along the optical axis. The focus adjustment algorithm might use the contrast search or phase detection methods to bring the image back in focus.

Another approach to be used if a temperature sensor is not available in the system is that the image processing unit performs MTF or sharpness value measurements in a timely manner to make sure that the image is always kept in focus.

One aspect of the design of the MEMS actuator to be used in such cameras (automotive, action cameras, drone, defense or other fixed focus cameras) is that the MEMS actuator used is required to be less sensitive to accelerations that might ensue from the motion of these cameras by the user or vehicle that carries the cameras. Such requirement can be achieved by making the MEMS actuator springs stiff enough such that they produce negligible motion when they are exposed to shocks or accelerations. This is to avoid having shaky or out of focus images/videos during instances when these cameras are subject to acceleration forces. Alternatively, a closed loop system could be used to make the actuator less sensitive to shocks instead of increasing the stiffness of the springs of the structure which may come at a design cost such as limiting the stroke of the actuator. The closed-loop system could include sensors (could be an embedded capacitive sensing electrode within the MEMS actuator or an accelerometer) that measures any fluctuations of the MEMS rotor due to undesired shocks and/or acceleration. The sensor signal could be utilized by the controller to increase or decrease the voltage applied to the MEMS actuator to counteract any undesired motion of the rotor such that the rotor is always kept at a desired position (focus position) regardless of acceleration and/or shocks the camera is subject to.

The present technology of using image sensor shift to compensate for the thermal drift in cameras enables these cameras to incorporate smaller pixel size sensors and hence increasing the image resolution. This is because the pixel size in the current fixed focus cameras is made relatively large as they have a large diameter circle of confusion due to the variations in the focal length. If such thermal compensation mechanism is used, the actuator movement mitigates the effects of the focal length changes and results in a smaller diameter of the circle of confusion, hence a smaller pixel size can be used.

It can be readily apparent to the one with ordinary skills in the art that the present autofocusing mechanism using image sensors with MEMS actuators, that are known to be highly accurate and fast, will have a number of software features that lead to better user experience. As an example, it enables all in-focus mode feature where multiple images can be taken at very high speed and the user can later, when displaying, choose which part of the image to focus on.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

With respect to the above description, it is to be realized that the optimum relationships for the parts of the invention in regard to size, shape, form, materials, function and manner of operation, assembly and use are deemed readily apparent and obvious to those skilled in the art, and all equivalent relationships to those illustrated in the drawings and described in the specification are intended to be encompassed by the present invention.

What is claimed is:

1. A wire bonding method for an image sensor attached to a MEMS actuator which comprises a stator (a fixed part) and a rotor (a moving part), wherein the rotor holds the image sensor and the wire bonding is done from the image sensor to a circuit board housed within a camera, the wire bonding method comprises the steps of:
   a) placing and sealing the MEMS actuator on a wire bonding stage that has a vacuum channel to connect to a vacuum pump;
   b) applying vacuum onto the wire bonding stage to generate vacuum inside the MEMS actuator and to pull down the rotor holding the image sensor towards the stator until the rotor and the image sensor become mechanically fixed, wherein the application of the vacuum is configured to prevent any damage to the moving part or change its profile;
   c) bonding a set of wires directly from the image sensor to a circuit board while the rotor is fixed, and
   d) releasing the vacuum and allowing the rotor to move back to a rest position.

2. A wire bonding method between a fixed part and a moving part of a MEMS device, comprising the steps of:
   a) placing and sealing the device on a wire bonding stage that has a vacuum channel to connect to a vacuum pump;
   b) applying vacuum onto the wire bonding stage to generate vacuum inside the device and to place the moving part to a mechanically fixed position, wherein the application of the vacuum is configured to prevent any damage to the moving part or change its profile;
   c) bonding a set of wires directly from the moving part to the fixed part, and
   d) releasing the vacuum and allowing the moving part to move back to a rest position.

3. A camera system, comprising:
   a) a lens barrel assembly;
   b) a lens holder to which the lens barrel is attached to;
   c) an IR filter;
   d) a MEMS actuator comprising of a moving part (a rotor), a fixed part (a stator) and a set of mechanical springs;
   e) an image sensor attached to the moving part of the MEMS actuator;
   f) a circuit board, wherein the lens barrel holder and the MEMS actuator are attached to;
   g) a set of bond wires bonded directly between the image sensor and the circuit board wherein the set of bond wires deform through the movement of the image sensor, and wherein each bond wire has a predefined loop height and a predefined wire shape to allow for the motion of the image sensor with low stress concentration, and
   h) a control system receives temperature measurement from a temperature sensor and moves the image sensor along an optical axis
   (z) accordingly in order to compensate for focal length changes that result from optics profile changes in response to temperature sensor.

4. The camera system of claim 3, wherein the MEMS actuator is configured to connect to a vacuum system to pull the moving part towards the fixed part to a mechanically fixed position.

5. The camera system of claim 4, wherein the fixed part of the MEMS actuator has an opening to connect to the vacuum system.

6. The camera system of claim 3, wherein the MEMS actuator is a MEMS piston-tube electrostatic actuator that provides a translational motion along the optical axis (z) and/or bi-axial tilt about the planar x-y axes.

7. The camera system in claim 3, wherein the MEMS actuator is placed within a housing package and is attached to the circuit board from a backside, wherein the circuit board has a cut-out that is sized to fit the image sensor and the set of bonds wires, and it is used as a mechanical stopper.

8. The camera system in claim 7, wherein the circuit board has an opening to connect to the a vacuum system.

9. The camera system in claim 3, wherein the MEMS actuator is placed and is attached to the circuit board from a topside.

10. The camera system in claim 3, wherein the set of mechanical springs are highly stiff to make the image sensor and the rotor less sensitive to sudden motions or accelerations while still sensitive to a voltage input.

11. The camera system in claim 3, wherein the lens barrel and the lens holder are combined in a single fixture during a manufacturing process forming a single lens assembly.

12. The camera system in claim 3, wherein the IR filter is attached to the lens barrel assembly or attached to the circuit board and supported with an IR holder.

13. The camera system in claim 3, further having an accelerometer that measures the shock or acceleration along the optical axis z inform the control system to move the image sensor in such a way to keep the image always in focus.

* * * * *